(12) United States Patent
Atsuji et al.

(10) Patent No.: US 11,845,697 B2
(45) Date of Patent: Dec. 19, 2023

(54) COMPOSITE SINTERED BODY, SEMICONDUCTOR MANUFACTURING APPARATUS MEMBER, AND METHOD OF MANUFACTURING COMPOSITE SINTERED BODY

(71) Applicant: NGK INSULATORS, LTD., Nagoya (JP)

(72) Inventors: Kyohei Atsuji, Nagoya (JP); Noboru Nishimura, Nagoya (JP); Asumi Nagai, Nagoya (JP); Yuji Katsuda, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 727 days.

(21) Appl. No.: 17/022,492

(22) Filed: Sep. 16, 2020

(65) Prior Publication Data

US 2020/0407279 A1 Dec. 31, 2020

Related U.S. Application Data

(63) Continuation of application No. PCT/JP2019/009511, filed on Mar. 8, 2019.

(30) Foreign Application Priority Data

Mar. 28, 2018 (WO) .................. PCT/JP2018/012832

(51) Int. Cl.
*C04B 35/117* (2006.01)
*C04B 35/64* (2006.01)
*H01L 21/683* (2006.01)

(52) U.S. Cl.
CPC ............ *C04B 35/117* (2013.01); *C04B 35/64* (2013.01); *H01L 21/6833* (2013.01);
(Continued)

(58) Field of Classification Search
CPC ..... C04B 35/117; C04B 35/64; C04B 35/645; C04B 35/622; C04B 2235/3206;
(Continued)

(56) References Cited

U.S. PATENT DOCUMENTS 5,135,896 A * 8/1992 Vezza .................. C04B 35/111
501/153
5,175,132 A * 12/1992 Ketcham ................. C04B 35/49
501/120

(Continued)

FOREIGN PATENT DOCUMENTS

CN 101265082 A 9/2008
CN 101786872 A 7/2010
(Continued)

OTHER PUBLICATIONS

Taiwanese Office Action (Application No. 108109447) dated Oct. 8, 2020.
(Continued)

*Primary Examiner* — Thienvu V Tran
*Assistant Examiner* — Sreeya Sreevatsa
(74) *Attorney, Agent, or Firm* — BURR PATENT LAW, PLLC (57) ABSTRACT

The composite sintered body includes $Al_2O_3$, and $MgAl_2O_4$. The content of $Al_2O_3$ in the composite sintered body is not less than 95.5% by weight. The average sintered grain size of $Al_2O_3$ in the composite sintered body is not less than 2 μm and not greater than 4 μm. The standard deviation of sintered grain size distribution of $Al_2O_3$ in the composite sintered body is not greater than 0.35. The bulk density of the composite sintered body is not less than 3.94 g/cm³ and not greater than 3.98 g/cm³. In the composite sintered body, the ratio of amount of crystal phase of $MgAl_2O_4$ to that of $Al_2O_3$ is not less than 0.003 and not greater than 0.01.

12 Claims, 2 Drawing Sheets

(52) U.S. Cl.
CPC .............. $C04B\ 2235/3206$ (2013.01); $C04B\ 2235/3217$ (2013.01); $C04B\ 2235/3222$ (2013.01); $C04B\ 2235/3826$ (2013.01); $C04B\ 2235/656$ (2013.01); $C04B\ 2235/763$ (2013.01); $C04B\ 2235/77$ (2013.01); $C04B\ 2235/784$ (2013.01); $C04B\ 2235/786$ (2013.01)

(58) Field of Classification Search
CPC .... C04B 2235/3217; C04B 2235/3222; C04B 2235/3826; C04B 2235/656; C04B 2235/763; C04B 2235/77; C04B 2235/784; C04B 2235/786; C04B 2235/5445; C04B 2235/6567; C04B 2235/96; C04B 2235/782; H01L 21/6833; H01L 21/68757; H01L 21/683
USPC ........................................................ 361/234
See application file for complete search history.

(56) References Cited

U.S. PATENT DOCUMENTS

| | | | | |
|---|---|---|---|---|
| 5,482,907 | A | * | 1/1996 | Tuan .................. C04B 35/42 501/153 |
| 2005/0187094 | A1 | * | 8/2005 | Hayashi .............. C04B 41/009 501/153 |
| 2012/0248716 | A1 | * | 10/2012 | Nobori .................. B32B 18/00 156/89.12 |
| 2015/0340121 | A1 | | 11/2015 | Ootomo et al. |

FOREIGN PATENT DOCUMENTS

| CN | 104761251 | A | 7/2015 |
|---|---|---|---|
| JP | 2002-324833 | A1 | 11/2002 |
| JP | 2003-321270 | A1 | 11/2003 |
| JP | 2005-272293 | A1 | 10/2005 |
| JP | 2012-216816 | A1 | 11/2012 |
| JP | 2015-109318 | A1 | 6/2015 |
| JP | 6032022 | B2 | 11/2016 |
| JP | 2017-095333 | A1 | 6/2017 |

OTHER PUBLICATIONS

English translation of the International Preliminary Report on Patentability (Chapter I)(Application No. PCT/JP2019/009511) dated Oct. 8, 2020.

Se-Won Han et al., "The Effect of Geometrical Nonuniformity on Electrical Characteristics of ZnO Varistors with $Al_2O_3$ Dopant," *2001 Annual Report Conference on Electrical Insulation and Dielectric Phenomena*, 2001, vol. 2001, pp. 63-66.

International Search Report and Written Opinion (Application No. PCT/JP2019/009511) dated May 28, 2019.

* cited by examiner

COMPOSITE SINTERED BODY, SEMICONDUCTOR MANUFACTURING APPARATUS MEMBER, AND METHOD OF MANUFACTURING COMPOSITE SINTERED BODY

CROSS-REFERENCE TO RELATED APPLICATION

The present application is a continuation application of International Application No. PCT/JP2019/009511 filed on Mar. 8, 2019, which claims priority to International Application No. PCT/JP2018/012832 filed on Mar. 28, 2018. The contents of these applications are incorporated herein by reference in their entirety.

TECHNICAL FIELD

The present invention relates to a composite sintered body, a semiconductor manufacturing apparatus member, and a method of manufacturing a composite sintered body.

BACKGROUND ART

In an apparatus of manufacturing a semiconductor substrate or the like, a susceptor such as an electrostatic chuck for adsorbing and holding the semiconductor substrate using a Coulomb force or Johnsen-Rahbek force, a heater for heating the semiconductor substrate, or an electrostatic chuck heater that combines them are conventionally utilized. The susceptor is required to have high withstand voltage and high volume resistivity. The susceptor is manufactured, for example, using a sintered body containing aluminum oxide as a main phase.

In the case where abnormal grain growth of aluminum oxide occurs during sintering the above sintered body, material properties of the sintered body may vary significantly. In Japanese Patent Application Laid-Open No. 2017-095333 (Document 1), by adding magnesium oxide to sintering raw material containing aluminum oxide as a main component in order to suppress grain growth of aluminum oxide, the average sintered grain size of aluminum oxide becomes 3 µm to 18 µm, and the coefficient of variation of sintered grain size distribution becomes 7% to 21%.

In Japanese Patent Application Laid-Open No. 2003-321270 (Document 2), silicon dioxide, magnesium oxide, calcium oxide, and zirconia oxide are added to sintering raw material containing aluminum oxide as a main component, and therefore the average sintered grain size of aluminum oxide becomes 0.8 µm to 4.6 µm and the bulk density becomes 3.80 $g/cm^3$ to 3.92 $g/cm^3$.

Japanese Patent Application Laid-Open No. 2005-272293 (Document 3) discloses a sintered body whose composition includes aluminum oxide, magnesium oxide, calcium oxide, and silicon oxide, and whose average grain size is 3.5 µm to 19.0 µm, as an example of an aluminum oxide sintered body used for a semiconductor manufacturing apparatus member (see Table 3).

Japanese Patent Application Laid-Open No. 2012-216816 (Document 4) describes a ceramic molded body for an electrostatic chuck as Example 5, which is manufactured by mixing 100 parts by weight of alumina powder, 0.2 parts by weight of magnesia, 0.3 parts by weight of magnesium fluoride, a dispersant, and a solvent, and by molding and sintering the mixture (see paragraphs 0058 to 0061). In the ceramic molded body of Example 5, the average grain size of the ceramic grains is 0.9 µm, and the standard deviation thereof is 0.3 µm. The grain boundary composition of the ceramic molded body of Example 5 is $MgAl_2O_4$ and MgO (see Table 2). In the ceramic molded body, by setting the average grain size of the ceramic grains to 0.7 µm to 1.2 µm, generation of particles is significantly suppressed (see paragraph 0018).

Japanese Patent Application Laid-Open No. 2015-109318 (Document 5) describes a technique where the average grain size of aluminum oxide is made not greater than 0.68 µm, and the coefficient of variation of grain size distribution is made not greater than 0.49, in order to improve wear resistance of a ceramic bonding capillary containing aluminum oxide crystals as a main phase.

Japanese Patent Application Laid-Open No. 2017-95333 (Document 6) discloses an alumina sintered body in which $MgAl_2O_4$ grains exist at the grain boundary of alumina grains. Comparative examples 9 and 10 in Table 2 disclose the alumina sintered body in which the average grain size of the alumina grains is 2 to 3 µm and which has a relatively small coefficient of grain size variation of 6 to 8%. In the sintered body of Comparative examples 9 and 10, the bulk density is 3.83 $g/cm^3$ to 3.85 $g/cm^3$ and the crystal phase amount ratio $MgAl_2O_4$/alumina is 0.021 to 0.027.

Japanese Patent No. 6032022 (Document 7) discloses a dielectric material for an electrostatic chuck in which 4 to 20% by weight of silicon carbide is added to aluminum oxide. Japanese Patent Application Laid-Open No. 2002-324833 (Document 8) discloses a technique of manufacturing an insulating member for an electrostatic chuck by molding mixed powder in which 1 to 10% by weight of silicon carbide is added to aluminum oxide and by sintering the molded body.

In the above sintered body of Document 1, when the average sintered grain size of aluminum oxide is set to the lower limit of 3 µm, the coefficient of variation of sintered grain size distribution increases to 13% and the uniformity of sintered grain size decrease. On the other hand, when the coefficient of variation of sintered grain size distribution is set to the lower limit of 7%, the average sintered grain size increases to 7 µm. Additionally, in the sintered body of Document 1, the standard deviation of sintered grain size distribution of aluminum oxide obtained from the above described coefficient of variation and average sintered grain size is 0.39 to 3.57. The standard deviation shows that the uniformity of sintered grain size is low in the sintered body of Document 1. That is, in the sintered body of Document 1, it is difficult to reduce the average sintered grain size and improve the uniformity of the sintered grain size at the same time. In addition, the maximum strength of the sintered body is not sufficiently high at 485 MPa. Further more, in the sintered body, the grain growth of aluminum oxide is not sufficiently suppressed, so that the withstand voltage and the volume resistivity are low, and it is considered that the material characteristics greatly vary when the sintering conditions vary.

The sintered body of Document 2 has a relatively low bulk density, and there are many defects in the sintered body, which are 0.7% to 3.9%. Further, the maximum value of the sintered grain size is 1.6 times or more the average value, and it is considered that the uniformity of the sintered grain size is low. Therefore, it is considered that the strength of the sintered body is low, and the withstand voltage and volume resistivity are also low.

In the ceramic molded body of Document 4, the average grain size of the ceramic grains is as small as 0.7 µm to 1.2 µm, and it is difficult to consider that the average grain size is made larger than 1.2 µm from the description in paragraph 0018 regarding suppression of particle generation. Therefore, it is difficult to consider that the average grain size of the ceramic grains having the standard deviation of grain size of 0.3 μm in Document 4 is set to 3.5 μm to 19.0 μm as in Document 3 by combining Document 4 with Document 3. Similarly, in the bonding capillary of Document 5, it is difficult to consider that the average grain size of aluminum oxide is made larger than 0.68 μm from the description regarding the improvement of wear resistance.

In the electrostatic chuck using the ceramic molded body of Document 4, when the content of $MgAl_2O_4$ increases, the thermal expansion coefficient of the ceramic molded body increases, and the difference from the thermal expansion coefficient of the metal or alloy used as the internal electrode becomes large. Therefore, in the sintering process, damage such as cracks or breaks may occur in the ceramic molded body due to the difference in the thermal expansion coefficients. However, Document 4 does not mention the content of $MgAl_2O_4$ and the like.

On the other hand, in the alumina sintered bodies of Comparative examples 9 and 10 of Document 6, the crystal phase amount ratio $MgAl_2O_4$/alumina is mentioned, but since the crystal phase amount ratio is as high as 0.021 to 0.027, the alumina sintered bodies may be damaged during sintering. Further, since the alumina sintered bodies of Comparative examples 9 and 10 have a low bulk density as described above, there is a possibility that the withstand voltage, the volume resistivity, the bending strength, and the like may become low.

In the dielectric material of Document 7, since the additive amount of silicon carbide that can be a conductive path is relatively large, it is difficult to increase the withstand voltage and the volume resistivity. In the dielectric material, in a corrosive atmosphere, the irregularities on the surface of the electrostatic chuck become significant with corrosion and dropout of silicon carbide which has a relatively low corrosion resistance, the irregularities cause further dropout of particles, and the amount of corrosion per unit time may increase or particles may be generated. The same applies to the insulating member for the electrostatic chuck of Document 8.

SUMMARY OF INVENTION

The present invention is intended for a composite sintered body, and it is an object of the present invention to provide a composite sintered body with high withstand voltage, high volume resistivity, and high bending strength. It is also an object of the present invention to suppress damage to the composite sintered body during manufacturing.

The composite sintered body according to a preferred embodiment of the present invention includes aluminum oxide, and magnesium aluminate spinel. A content of the aluminum oxide is not less than 95.5% by weight. An average sintered grain size of the aluminum oxide is not less than 2 μm and not greater than 4 μm. A standard deviation of sintered grain size distribution of the aluminum oxide is not greater than 0.35. A bulk density of the composite sintered body is not less than 3.94 g/cm³ and not greater than 3.98 g/cm³. A ratio of amount of crystal phase of the magnesium aluminate spinel to that of the aluminum oxide is not less than 0.003 and not greater than 0.01. By the present invention, it is possible to provide a composite sintered body with high withstand voltage, high volume resistivity, and high bending strength. It is also possible to suppress damage to the composite sintered body during manufacturing.

Preferably, the composite sintered body further includes silicon carbide, and a content of the silicon carbide is not less than 0.01% by weight and not greater than 4% by weight.

Preferably, a content of magnesium in the composite sintered body is not greater than 0.35% by weight.

Preferably, a withstand voltage of the composite sintered body is not less than 100 kV/mm.

Preferably, a volume resistivity of the composite sintered body at 250° C. is not less than $1.0 \times 10^{15}$ Ω·cm.

Preferably, a four-point bending strength of the composite sintered body is not less than 450 MPa.

The present invention is also intended for a semiconductor manufacturing apparatus member used in a semiconductor manufacturing apparatus. The semiconductor manufacturing apparatus member according to a preferred embodiment of the present invention is formed by using the above composite sintered body. By the present invention, it is possible to provide a semiconductor manufacturing apparatus member with high withstand voltage and high volume resistivity.

Preferably, the semiconductor manufacturing apparatus member includes a plate-like main body formed by using the composite sintered body, having an upper surface on which a semiconductor substrate is to be placed, and an internal electrode located inside the main body.

The present invention is also intended for a method of manufacturing a composite sintered body. The method of manufacturing a composite sintered body according to a preferred embodiment of the present invention includes a) molding mixed powder in which aluminum oxide and magnesium oxide are mixed, into a green body having a predetermined shape, and b) generating a composite sintered body by sintering the green body. A content of the aluminum oxide in the mixed powder in the operation a) is not less than 95.5% by weight. An average sintered grain size of the aluminum oxide after completion of the operation b) is not less than 2 μm and not greater than 4 μm. A standard deviation of sintered grain size distribution of the aluminum oxide after completion of the operation b) is not greater than 0.35. A bulk density of the composite sintered body is not less than 3.94 g/cm³ and not greater than 3.98 g/cm³. The composite sintered body includes magnesium aluminate spinel, and a ratio of amount of crystal phase of the magnesium aluminate spinel to that of the aluminum oxide is not less than 0.003 and not greater than 0.01. By the present invention, it is possible to easily manufacture a composite sintered body with high withstand voltage, high volume resistivity, and high bending strength. It is also possible to suppress damage to the composite sintered body during manufacturing.

Preferably, the mixed powder contains silicon carbide in the operation a), and a content of the silicon carbide in the mixed powder is not less than 0.01% by weight and not greater than 4% by weight.

Preferably, a content of the magnesium oxide in the mixed powder in the operation a) is not greater than 0.5% by weight.

Preferably, a sintering temperature in the operation b) is not lower than 1550° C. and not higher than 1700° C.

These and other objects, features, aspects and advantages of the present invention will become more apparent from the following detailed description of the present invention when taken in conjunction with the accompanying drawings.

DESCRIPTION OF EMBODIMENTS

Figure 1:
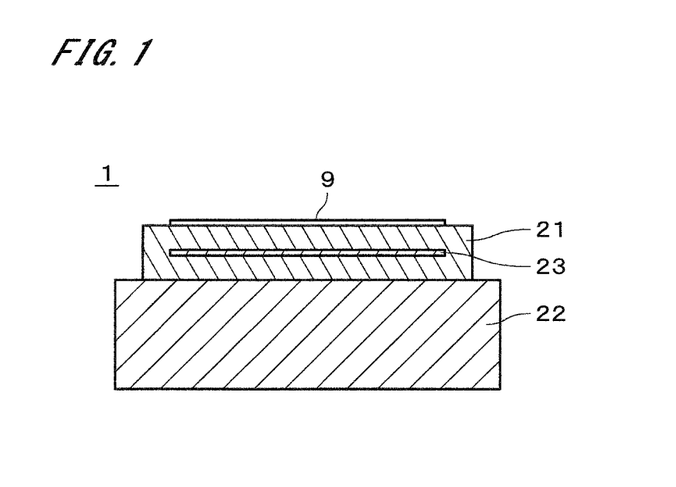
FIG. 1 is a cross section of an electrostatic chuck.

FIG. 1 is a cross section of a susceptor 1 according to an embodiment of the present invention. The susceptor 1 is a semiconductor manufacturing apparatus member used in a semiconductor manufacturing apparatus. The susceptor 1 holds a semiconductor substrate 9 (hereinafter, referred to simply as a "substrate 9") having a substantially disk-like shape from the lower side in FIG. 1. In the following description, the upper side and the lower side of FIG. 1 are referred to simply as an "upper side" and a "lower side", respectively. Further, the up-and-down direction of FIG. 1 is referred to simply as an "up-and-down direction". The up-and-down direction of FIG. 1 does not necessarily have to coincide with an actual up-and-down direction in a case where the susceptor 1 is provided in the semiconductor manufacturing apparatus.

The susceptor 1 includes a main body 21, a base part 22, and an internal electrode 23. The main body 21 is a substantially plate-like (e.g., substantially disk-like) member formed by using a composite sintered body described later. On an upper surface of the main body 21, the substrate 9 is placed. The base part 22 is a substantially plate-like (e.g., substantially disk-like) member that is larger than the main body 21 in a plan view. The main body 21 is attached on the base part 22.

The internal electrode 23 is located (buried) inside the main body 21. The internal electrode 23 is, for example, a substantially disk-like metal member. The internal electrode 23 is preferably formed of metal having a relatively high melting point. As such the metal, for example, tantalum (Ta), tungsten (W), molybdenum (Mo), platinum (Pt), rhenium (Re), hafnium (Hf), or an alloy thereof is used.

In the example shown in FIG. 1, the susceptor 1 is an electrostatic chuck for adsorbing and holding the substrate 9 using a Coulomb force or Johnsen-Rahbek force. In the susceptor 1, when a DC voltage is applied between the internal electrode 23 and the substrate 9, a portion of the main body 21 between the internal electrode 23 and the substrate 9 acts as a dielectric layer, and therefore the substrate 9 is adsorbed on the upper surface of the main body 21. Although not shown, a resistance heating element (i.e., heater electrode) for heating the substrate 9 may be provided inside the main body 21.

The main body 21 of the susceptor 1 is formed by using the composite sintered body containing aluminum oxide ($Al_2O_3$), silicon carbide (SiC), and magnesium aluminate spinel ($MgAl_2O_4$). The magnesium aluminate spinel is simply referred to as "spinel". In the following description, it is assumed that the entire main body 21 is formed by using the composite sintered body.

The main phase of the composite sintered body constituting the main body 21 (hereinafter, referred to simply as a "composite sintered body") is the above-described $Al_2O_3$. In the composite sintered body, grains of SiC and grains of $MgAl_2O_4$ are dispersed in the $Al_2O_3$.

The content of $Al_2O_3$ in the composite sintered body is not less than 95.5% by weight and less than 100% by weight. The content of $Al_2O_3$ is preferably not less than 97% by weight, and more preferably not less than 98.5% by weight. The upper limit of the content of $Al_2O_3$ is not particularly limited as long as it is less than 100% by weight. The content is typically not greater than 99.8% by weight, and more typically not greater than 99% by weight.

The content of SiC in the composite sintered body is preferably not greater than 4% by weight, more preferably not greater than 2% by weight, and further preferably not greater than 1% by weight. Although the lower limit of the content of SiC is not particularly limited, the content is typically not lower than 0.1% by weight, and more typically not less than 0.5% by weight. The composite sintered body may be essentially free of SiC. "Essentially free of SiC" means that the content of SiC in the composite sintered body is less than 0.01% by weight.

The content of magnesium (Mg) in the composite sintered body is preferably not greater than 0.35% by weight. The content of Mg is the percentage of all Mg contained in the composite sintered body, such as Mg contained in above-described $MgAl_2O_4$ and Mg solid-dissolved in $Al_2O_3$. The content of Mg is more preferably not greater than 0.07% by weight. The lower limit of the content of Mg is not particularly limited as long as it is greater than 0% by weight. The content is typically not less than 0.02% by weight, and more typically not less than 0.05% by weight.

The open porosity of the composite sintered body is preferably less than 0.1%, more preferably less than 0.05%, and further preferably substantially 0.0%. The bulk density of the composite sintered body is preferably 3.94 g/cm$^3$ to 3.98 g/cm$^3$, more preferably 3.96 g/cm$^3$ to 3.97 g/cm$^3$.

The withstand voltage (i.e., dielectric strength voltage) of the composite sintered body is preferably not less than 100 kV/mm, more preferably not less than 150 kV/mm, and further preferably not less than 200 kV/mm.

The volume resistivity of the composite sintered body at 250° C. is preferably not less than $1.0 \times 10^{15}$ Ω·cm, more preferably not less than $5.0 \times 10^{15}$ Ω·cm, and further preferably not less than $1.0 \times 10^{16}$ Ω·cm.

The four-point bending strength of the composite sintered body is preferably not less than 450 MPa, more preferably not less than 500 MPa, and further preferably not less than 550 MPa.

The average sintered grain size of $Al_2O_3$ in the composite sintered body is preferably 2 μm to 4 μm, more preferably 2.3 μm to 3.7 μm, and further preferably 2.5 μm to 3.5 μm. The standard deviation of sintered grain size distribution of $Al_2O_3$ in the composite sintered body is not greater than 0.35, preferably not greater than 0.25, and more preferably not greater than 0.15.

Figure 2:
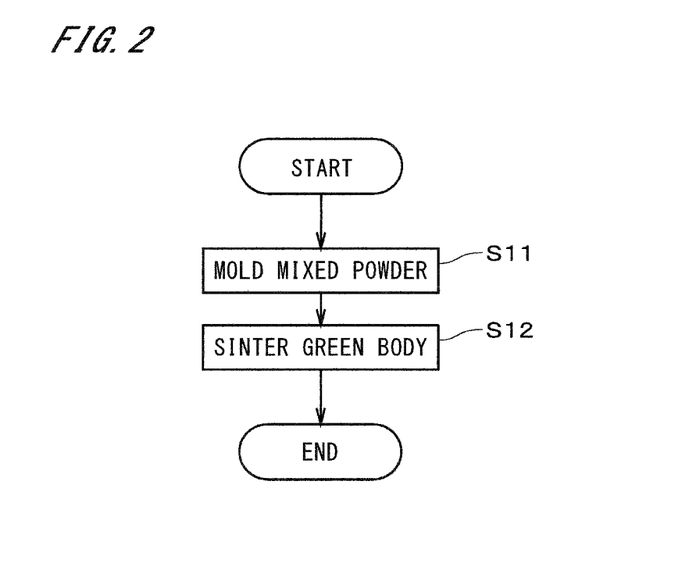
FIG. 2 is a flowchart of manufacturing a chuck main body.

Next, with reference to FIG. 2, an example of a method of manufacturing the above-described composite sintered body (i.e., the main body 21 of the susceptor 1) will be described. For manufacturing the composite sintered body, first, mixed powder in which $Al_2O_3$, SiC, and MgO are mixed is obtained. Then, the mixed powder is molded into a green body having a predetermined shape (Step S11). In Step S11, for example, powders of $Al_2O_3$, SiC, and MgO are wet-mixed in an organic solvent, to thereby become a slurry. Subsequently, the slurry is dried to become mixed powder (i.e., prepared powder), and the mixed powder is molded into the above-described green body. The solvent in wet-mixing may be, for example, ion-exchange water. Further, the powders of $Al_2O_3$, SiC, and MgO may be dry-mixed, instead of being wet-mixed.

The mixed powder is filled into, for example, a die for uniaxial pressing, to be thereby formed into a green body having a predetermined shape. When the shape of the green body is a plate-like shape, the mixed powder may be filled into a hot press die, or the like, to be thereby molded. Formation of the green body may be performed by any one of various other methods only if the shape can be maintained. Further, like the above-described slurry, the mixed powder may be formed into a green body having a predetermined shape by inpouring the mixed powder in a fluid state into a mold and then removing the solvent component. The green body formed in Step S11, for example, has a substantially disk-like shape which is substantially the same shape as that of the main body 21.

In Step S11, the content of $Al_2O_3$ in the above mixed powder is not less than 95.5% by weight and less than 100% by weight. The content of SiC in the mixed powder is preferably not greater than 4.0% by weight. The content of MgO in the mixed powder is preferably greater than 0% by weight and not greater than 0.5% by weight. The content of MgO in the mixed powder is more preferably not less than 0.03% by weight.

After the green body is obtained in Step S11, sintering of the green body is performed and the above-described composite sintered body containing $Al_2O_3$, SiC, and $MgAl_2O_4$ is thereby generated (Step S12). In Step S12, $Al_2O_3$ and MgO in the mixed powder react with each other to generate $MgAl_2O_4$. The sintering temperature in Step S12 (i.e., the maximum temperature during sintering) is preferably 1550° C. to 1700° C. In Step S12, for example, the green body is sintered by the hot-press method. Specifically, the green body is put in the hot press die and then heated and pressurized, and the composite sintered body is thereby obtained. Sintering of the green body is performed, for example, under vacuum atmosphere or non-oxidizing atmosphere. The heating temperature, the press pressure, and the sintering time at the hot press may be determined as appropriate.

In Step S11, there may be a case where the mixed powder is the mixture of $Al_2O_3$ and MgO and it is essentially free of SiC. "Essentially free of SiC" means that the content of SiC in the mixed powder is less than 0.01% by weight. In this case, the composite sintered body generated in Step S12 contains $Al_2O_3$ and $MgAl_2O_4$, and does not essentially contain SiC.

The internal electrode 23 may be generated inside the main body 21, for example, by burying a metal material inside the above-described green body in parallel with Step S11 and sintering the metal material together with the green body in Step S12. Alternatively, the internal electrode 23 may be placed inside the main body 21 formed of the two composite sintered bodies generated in Steps S11 and S12 by sandwiching the internal electrode 23 between the two composite sintered bodies. Generation and placement of the internal electrode 23 may be performed by any one of various methods.

Next, with reference to Tables 1 to 4, Examples 1 to 22 of the composite sintered body according to the present invention and composite sintered bodies of Comparative examples 1 to 7 to be compared with the composite sintered bodies of the present invention will be described. In Table 1, the raw material composition of each composite sintered body and the sintering temperature are shown. In the raw material composition, the percentage by weight of each component in the mixed powder of the raw material is shown.

As shown in Table 1, in Comparative example 1, only $Al_2O_3$ is the raw material, and the additive such as MgO, SiC, or the like is not contained in the raw material. In Comparative example 2, Examples 1 to 3, and Comparative example 3, only $Al_2O_3$ and MgO are contained in the raw material, and SiC is not contained in the raw material. In Examples 4 to 22 and Comparative examples 4 to 7, only $Al_2O_3$, MgO, and SiC are contained in the raw material.

Raw Material Powder $Al_2O_3$ used in the raw material was commercially-available $Al_2O_3$ powder having a purity of 99.99% or higher and an average particle diameter of 0.4 to 0.6 μm. MgO used in the raw material was commercially-available MgO powder having a purity of 99.9% or higher and an average particle diameter of 1 μm or less. SiC used in the raw material was commercially-available SiC powder having a purity of 99% or higher. In Examples 4 to 8, the average particle diameter of the raw material SiC was 0.3 μm. In Examples 9 to 22 and Comparative examples 4 to 7, the average particle diameter of the raw material SiC was 2.5 μm.

Mixed Powder

The above raw material powder was weighed to have a percentage by weight shown in Table 1 and wet-mixed in the ball mill for 15 hours. In the wet mixing, alumina boulders with a diameter of 3 mm were used, and the solvent used was isopropyl alcohol (IPA). Then, the slurry obtained by the wet mixing was dried under an $N_2$ atmosphere and sized with a 30-mesh sieve to obtain the mixed powder as the raw material. The mixed powder may be obtained by drying the slurry with a rotary evaporator and then sizing with a 100-mesh sieve. Alternatively, a granulated powder may be obtained using a spray dryer or the like. In the case where the carbon component comes to be mixed in the slurry during the wet mixing, the mixed powder may be heat-treated to remove the carbon component, if necessary. The heat treatment is performed, for example, at 450° C. for 5 hours or more in air atmosphere.

Molding

Uniaxial pressing of the above mixed powder was performed with a pressure of 100 to 150 kgf/cm², to thereby form a disk-like green body having a diameter of 50 mm and a thickness of about 20 mm, and the green body was accommodated in the hot-press die. The molding pressure is not particularly limited but may be variously changed only if the shape can be maintained. The mixed powder may be filled into the hot-press die in a state of unmolded powder.

Sintering

The above green body was sintered under vacuum atmosphere by the hot-press method. The press pressure was 250 kgf/cm². The maximum temperature during heating was from 1550° C. to 1700° C., and the holding time at the maximum temperature was 4 to 8 hours.

TABLE 1

| | Preparation Condition | | | | |
| --- | --- | --- | --- | --- | --- |
| | Raw Material Composition | | | | |
| | $Al_2O_3$ | MgO | SiC | | |
| | Content % by weight | Content % by weight | Particle Diameter μm | Content % by weight | Sintering Temperature ° C. |
| Comparative example 1 | 100.0 | — | — | — | 1600 |
| Comparative example 2 | 99.95 | 0.05 | — | — | 1600 |
| Example 1 | 99.92 | 0.08 | — | — | 1600 |
| Example 2 | 99.9 | 0.1 | — | — | 1600 |
| Example 3 | 99.8 | 0.2 | — | — | 1600 |
| Comparative example 3 | 99.5 | 0.5 | — | — | 1600 |

TABLE 1-continued

| | Preparation Condition | | | | |
|---|---|---|---|---|---|
| | Raw Material Composition | | | | |
| | Al$_2$O$_3$ | MgO | SiC | | |
| | Content % by weight | Content % by weight | Particle Diameter μm | Content % by weight | Sintering Temperature ° C. |
| Example 4 | 99.8 | 0.1 | 0.3 | 0.1 | 1600 |
| Example 5 | 99.4 | 0.1 | 0.3 | 0.5 | 1600 |
| Example 6 | 98.9 | 0.1 | 0.3 | 1.0 | 1600 |
| Example 7 | 97.9 | 0.1 | 0.3 | 2.0 | 1600 |
| Example 8 | 95.9 | 0.1 | 0.3 | 4.0 | 1600 |
| Example 9 | 99.8 | 0.1 | 2.5 | 0.1 | 1600 |
| Example 10 | 99.4 | 0.1 | 2.5 | 0.5 | 1600 |
| Example 11 | 98.9 | 0.1 | 2.5 | 1.0 | 1600 |
| Example 12 | 97.9 | 0.1 | 2.5 | 2.0 | 1600 |
| Example 13 | 95.9 | 0.1 | 2.5 | 4.0 | 1600 |
| Example 14 | 98.8 | 0.2 | 2.5 | 1.0 | 1600 |
| Comparative example 4 | 98.5 | 0.5 | 2.5 | 1.0 | 1600 |
| Example 15 | 99.8 | 0.1 | 2.5 | 0.1 | 1550 |
| Example 16 | 99.4 | 0.1 | 2.5 | 0.5 | 1550 |
| Example 17 | 98.9 | 0.1 | 2.5 | 1.0 | 1550 |
| Example 18 | 98.97 | 0.03 | 2.5 | 1.0 | 1550 |
| Example 19 | 98.93 | 0.07 | 2.5 | 1.0 | 1550 |
| Comparative example 5 | 99.8 | 0.1 | 2.5 | 0.1 | 1650 |
| Example 20 | 99.4 | 0.1 | 2.5 | 0.5 | 1650 |
| Example 21 | 98.9 | 0.1 | 2.5 | 1.0 | 1650 |
| Comparative example 6 | 99.8 | 0.1 | 2.5 | 0.1 | 1700 |
| Comparative example 7 | 99.4 | 0.1 | 2.5 | 0.5 | 1700 |
| Example 22 | 98.9 | 0.1 | 2.5 | 1.0 | 1700 |

TABLE 2

| | Sintered Body Characteristic | | | |
|---|---|---|---|---|
| | Constituent Phase | Crystal Phase Amount Ratio MgAl$_2$O$_4$/Al$_2$O$_3$ | Mg Content % by weight | Si Content % by weight |
| Comparative example 1 | Al$_2$O$_3$ | 0.000 | — | — |
| Comparative example 2 | Al$_2$O$_3$, MgAl$_2$O$_4$ | 0.002 | 0.03 | — |
| Example 1 | Al$_2$O$_3$, MgAl$_2$O$_4$ | 0.003 | 0.05 | — |
| Example 2 | Al$_2$O$_3$, MgAl$_2$O$_4$ | 0.004 | 0.07 | — |
| Example 3 | Al$_2$O$_3$, MgAl$_2$O$_4$ | 0.008 | 0.14 | — |
| Comparative example 3 | Al$_2$O$_3$, MgAl$_2$O$_4$ | 0.020 | 0.34 | — |
| Example 4 | Al$_2$O$_3$, MgAl$_2$O$_4$, SiC | 0.007 | 0.06 | 0.07 |
| Example 5 | Al$_2$O$_3$, MgAl$_2$O$_4$, SiC | 0.006 | 0.07 | 0.33 |
| Example 6 | Al$_2$O$_3$, MgAl$_2$O$_4$, SiC | 0.005 | 0.07 | 0.67 |
| Example 7 | Al$_2$O$_3$, MgAl$_2$O$_4$, SiC | 0.005 | 0.07 | 1.33 |
| Example 8 | Al$_2$O$_3$, MgAl$_2$O$_4$, SiC | 0.004 | 0.06 | 2.67 |
| Example 9 | Al$_2$O$_3$, MgAl$_2$O$_4$, SiC | 0.006 | 0.07 | 0.07 |
| Example 10 | Al$_2$O$_3$, MgAl$_2$O$_4$, SiC | 0.006 | 0.06 | 0.33 |
| Example 11 | Al$_2$O$_3$, MgAl$_2$O$_4$, SiC | 0.005 | 0.06 | 0.66 |
| Example 12 | Al$_2$O$_3$, MgAl$_2$O$_4$, SiC | 0.005 | 0.07 | 1.34 |
| Example 13 | Al$_2$O$_3$, MgAl$_2$O$_4$, SiC | 0.005 | 0.07 | 2.66 |
| Example 14 | Al$_2$O$_3$, MgAl$_2$O$_4$, SiC | 0.010 | 0.14 | 2.65 |
| Comparative example 4 | Al$_2$O$_3$, MgAl$_2$O$_4$, SiC | 0.022 | 0.34 | 2.64 |
| Example 15 | Al$_2$O$_3$, MgAl$_2$O$_4$, SiC | 0.007 | 0.07 | 0.07 |
| Example 16 | Al$_2$O$_3$, MgAl$_2$O$_4$, SiC | 0.006 | 0.07 | 0.33 |
| Example 17 | Al$_2$O$_3$, MgAl$_2$O$_4$, SiC | 0.005 | 0.07 | 0.67 |
| Example 18 | Al$_2$O$_3$, MgAl$_2$O$_4$, SiC | 0.003 | 0.02 | 0.67 |
| Example 19 | Al$_2$O$_3$, MgAl$_2$O$_4$, SiC | 0.004 | 0.05 | 0.66 |
| Comparative example 5 | Al$_2$O$_3$, MgAl$_2$O$_4$, SiC | 0.007 | 0.06 | 0.07 |
| Example 20 | Al$_2$O$_3$, MgAl$_2$O$_4$, SiC | 0.007 | 0.07 | 0.33 |
| Example 21 | Al$_2$O$_3$, MgAl$_2$O$_4$, SiC | 0.006 | 0.07 | 0.66 |
| Comparative example 6 | Al$_2$O$_3$, MgAl$_2$O$_4$, SiC | 0.008 | 0.07 | 0.07 |
| Comparative example 7 | Al$_2$O$_3$, MgAl$_2$O$_4$, SiC | 0.007 | 0.07 | 0.32 |
| Example 22 | Al$_2$O$_3$, MgAl$_2$O$_4$, SiC | 0.006 | 0.07 | 0.66 |

TABLE 3

| | Sintered Body Characteristic | | | |
|---|---|---|---|---|
| | Open Porosity % | Bulk Density g/cm$^3$ | Sintered Grain Size of Al$_2$O$_3$ μm | Standard Deviation of Sintered Grain Size of Al$_2$O$_3$ |
| Comparative example 1 | 0.0 | 3.98 | 6.7 | 1.27 |
| Comparative example 2 | 0.0 | 3.98 | 3.8 | 0.54 |
| Example 1 | 0.0 | 3.97 | 3.3 | 0.35 |
| Example 2 | 0.0 | 3.97 | 3.1 | 0.29 |
| Example 3 | 0.0 | 3.97 | 3.0 | 0.28 |
| Comparative example 3 | 0.0 | 3.96 | 3.0 | 0.27 |
| Example 4 | 0.0 | 3.98 | 3.0 | 0.21 |
| Example 5 | 0.0 | 3.97 | 2.9 | 0.15 |
| Example 6 | 0.0 | 3.96 | 2.7 | 0.13 |
| Example 7 | 0.0 | 3.95 | 2.6 | 0.11 |
| Example 8 | 0.0 | 3.94 | 2.5 | 0.11 |
| Example 9 | 0.0 | 3.98 | 3.0 | 0.20 |
| Example 10 | 0.0 | 3.97 | 2.9 | 0.14 |
| Example 11 | 0.0 | 3.96 | 2.7 | 0.12 |
| Example 12 | 0.0 | 3.95 | 2.6 | 0.11 |
| Example 13 | 0.0 | 3.94 | 2.6 | 0.11 |
| Example 14 | 0.0 | 3.96 | 2.6 | 0.11 |
| Comparative example 4 | 0.0 | 3.95 | 2.5 | 0.11 |
| Example 15 | 0.0 | 3.97 | 2.9 | 0.08 |
| Example 16 | 0.0 | 3.97 | 2.6 | 0.06 |
| Example 17 | 0.0 | 3.96 | 2.3 | 0.05 |
| Example 18 | 0.0 | 3.96 | 3.5 | 0.35 |
| Example 19 | 0.0 | 3.96 | 2.7 | 0.12 |
| Comparative example 5 | 0.0 | 3.98 | 4.1 | 0.39 |
| Example 20 | 0.0 | 3.98 | 3.9 | 0.23 |
| Example 21 | 0.0 | 3.97 | 3.3 | 0.17 |
| Comparative example 6 | 0.0 | 3.98 | 5.1 | 0.61 |
| Comparative example 7 | 0.0 | 3.98 | 4.8 | 0.36 |
| Example 22 | 0.0 | 3.97 | 3.8 | 0.22 |

TABLE 4

| | Sintered Body Characteristic | | |
|---|---|---|---|
| | Withstand Voltage kV/mm | Four-Point Bending Strength MPa | Volume Resistivity (250° C.) Ω · cm |
| Comparative example 1 | 74 | 440 | 2.6E+12 |
| Comparative example 2 | 108 | 445 | 3.0E+15 |

TABLE 4-continued

| | Sintered Body Characteristic | | |
|---|---|---|---|
| | Withstand Voltage kV/mm | Four-Point Bending Strength MPa | Volume Resistivity (250° C.) Ω·cm |
| Example 1 | 115 | 460 | 4.6E+15 |
| Example 2 | 124 | 491 | 5.6E+15 |
| Example 3 | 133 | 503 | 6.0E+15 |
| Comparative example 3 | 140 | 505 | 6.2E+15 |
| Example 4 | >200 | 555 | 8.0E+15 |
| Example 5 | >200 | 564 | 3.0E+16 |
| Example 6 | >200 | 569 | 4.5E+16 |
| Example 7 | >200 | 584 | 7.0E+16 |
| Example 8 | >200 | 590 | 7.1E+16 |
| Example 9 | >200 | 552 | 1.0E+16 |
| Example 10 | >200 | 566 | 1.7E+16 |
| Example 11 | >200 | 580 | 6.0E+16 |
| Example 12 | >200 | 594 | 8.0E+16 |
| Example 13 | >200 | 596 | 8.2E+16 |
| Example 14 | >200 | 582 | 6.2E+16 |
| Comparative example 4 | >200 | 585 | 6.5E+16 |
| Example 15 | >200 | 574 | 3.9E+16 |
| Example 16 | >200 | 604 | 6.0E+16 |
| Example 17 | >200 | 625 | 8.0E+16 |
| Example 18 | >200 | 550 | 6.4E+16 |
| Example 19 | >200 | 603 | 7.9E+16 |
| Comparative example 5 | >200 | 448 | 7.0E+15 |
| Example 20 | >200 | 532 | 1.3E+16 |
| Example 21 | >200 | 566 | 3.1E+16 |
| Comparative example 6 | 180 | 395 | 5.3E+15 |
| Comparative example 7 | 190 | 448 | 9.4E+15 |
| Example 22 | 195 | 489 | 1.0E+16 |

Evaluation

The composite sintered body obtained by the above-described sintering was processed for each type of evaluation, and evaluations shown in Tables 2 and 4 were performed.

As to the constituent phases of the composite sintered body, crystal phases of powder obtained by pulverizing the composite sintered body using a mortar were identified by an X-ray diffraction (XRD) apparatus. The measurement conditions were that CuKα, 40 kV, 40 mA, and 2θ=10 to 70°, and a sealed-tube X-ray diffraction apparatus (D8-ADVANCE manufactured by Bruker AXS) was used. The step width of the measurement was 0.02°. When the content of a constituent phase was low and the peak thereof could not be detected by X-ray diffraction, the existence of the constituent phase was confirmed by microstructure observation using SEM (scanning electron microscope) or EDX (energy dispersive X-ray analysis).

The ratio of the amount of crystal phase of $MgAl_2O_4$ to that of $Al_2O_3$ in the composite sintered body was obtained by dividing the peak intensity of the (311) plane of the crystal phase of $MgAl_2O_4$ by the peak intensity of the (113) plane of the crystal phase of $Al_2O_3$, using the measurement result of the above X-ray diffraction. The ratio between the amounts of crystal phases is a value obtained by dividing the amount of crystal phase of $MgAl_2O_4$ in the composite sintered body by that of $Al_2O_3$ thereof, and hereinafter referred to as a "crystal phase amount ratio $MgAl_2O_4/Al_2O_3$".

The contents of Mg and Si in the composite sintered body were obtained by the analysis method according to "JIS R1649".

The open porosity and the bulk density were measured by the Archimedes' method using pure water as a solvent.

The sintered grain size of $Al_2O_3$ was measured by the intercept method. Specifically, an arbitrary number of line segments were drawn in the SEM image obtained by observing a polished surface of the composite sintered body, and the number n of crystal grains which each line segment of length L crossed was obtained. When the end of the line segment was located in a crystal grain, the number of the crystal grain was counted as ½. The value obtained by dividing the length L of the line segment by n was taken as the average crystal granularity (that is, the average intercept length) 1, and the value obtained by multiplying the 1 by a coefficient of 1.5 was taken as the average sintered grain size. In addition, the standard deviation of the sintered grain size of $Al_2O_3$ was calculated from the results obtained by the above intercept method.

The withstand voltage was an instantaneous withstand voltage measured by applying a DC voltage in the atmosphere and at room temperature using a test piece having a thickness of 0.2 mm by the method according to "JIS C2141". In terms of the performance of the measurement apparatus, a withstand voltage larger than 200 kV/mm could not be measured. The four-point bending strength was calculated by performing the four-point bending test according to "JIS R1601".

The volume resistivity was measured by the method according to "JIS C2141" under vacuum atmosphere at 250° C. The specimen configuration was 50 mm (diameter)×0.4 mm. The diameter of a main electrode was 20 mm. The inner diameter and the outer diameter of a guard electrode were 30 mm and 40 mm, respectively. The diameter of an application electrode was 45 mm. The main electrode, the guard electrode, and the application electrode were formed of Ag (silver). The applied voltage was 5 kV/mm. The current value was read 60 minutes after the start of the voltage application, and the volume resistivity was calculated from the current value.

Comparative Examples 1 and 2

The sintering temperature in Comparative examples 1 to 2 was 1600° C. The constituent phases of the sintered body of Comparative example 1 were $Al_2O_3$ single phase. The average sintered grain size of $Al_2O_3$ was greater than 4 μm, and the standard deviation of sintered grain size distribution of $Al_2O_3$ was greater than 0.35. That is, the average sintered grain size of $Al_2O_3$ was large, and the uniformity of the sintered grain size was low. In the sintered body of Comparative example 1, the withstand voltage was less than 100 kV/mm, the four-point bending strength was less than 450 MPa, and the volume resistivity at 250° C. was less than $1.0×10^{15}$ Ω·cm. That is, in Comparative example 1, all of the withstand voltage, the four-point bending strength and the volume resistivity were low.

The constituent phases of the composite sintered body of Comparative example 2 were $Al_2O_3$ and $MgAl_2O_4$. The standard deviation of sintered grain size distribution of $Al_2O_3$ was greater than 0.35, and thus the uniformity of the sintered grain size of $Al_2O_3$ was low. The four-point bending strength of the composite sintered body of Comparative example 2 was less than 450 MPa. That is, the four-point bending strength was low in Comparative example 2.

Examples 1 to 3 and Comparative Example 3

In Examples 1 to 3 and Comparative example 3, the raw materials did not contain SiC, and the contents of MgO in the raw materials were not less than 0.07% by weight, which were different from each other. The sintering temperature in Examples 1 to 3 and Comparative example 3 was 1600° C. In Examples 1 to 3 and Comparative example 3, the constituent phases of each composite sintered body which were identified by the X-ray diffraction were $Al_2O_3$ and $MgAl_2O_4$.

In Examples 1 to 3 and Comparative example 3, the content of $Al_2O_3$ in the composite sintered body was not less than 95.5% by weight, and the content of Mg was not greater than 0.35% by weight. Specifically, in Examples 1 and 2, the content of Mg in the composite sintered body was not greater than 0.07% by weight. In Examples 1 to 3, the crystal phase amount ratio $MgAl_2O_4/Al_2O_3$ in the composite sintered body was 0.003 to 0.008. On the other hand, in Comparative example 3, the crystal phase amount ratio $MgAl_2O_4/Al_2O_3$ was as large as 0.020.

In Examples 1 to 3 and Comparative example 3, the open porosity of the composite sintered body was less than 0.05%, and substantially 0.0%. The bulk density of the composite sintered body was not less than 3.96 g/cm$^3$ and not greater than 3.97 g/cm$^3$. The bulk density of the composite sintered body decreased as the content of MgO in the raw material increased.

In Examples 1 to 3 and Comparative example 3, the average sintered grain size of $Al_2O_3$ in the composite sintered body was not less than 2 μm and not greater than 4 μm, and the standard deviation of sintered grain size distribution of $Al_2O_3$ was not greater than 0.35. That is, the average sintered grain size of $Al_2O_3$ was small, and the uniformity of the sintered grain size was high. Specifically, in Examples 1 to 3 and Comparative example 3, the average sintered grain size of $Al_2O_3$ in the composite sintered body was not greater than 3.5 μm. The average sintered grain size of $Al_2O_3$ and the standard deviation of sintered grain size distribution of $Al_2O_3$ decreased as the content of MgO in the raw material increased.

In each composite sintered body of Examples 1 to 3 and Comparative example 3, the withstand voltage was not less than 100 kV/mm, the four-point bending strength was not less than 450 MPa, and the volume resistivity at 250° C. was not less than 1.0×10$^{15}$ Ω·cm. That is, in Examples 1 to 3 and Comparative example 3, all of the withstand voltage, the four-point bending strength, and the volume resistivity were high. Specifically, the volume resistivity at 250° C. of the composite sintered body of Examples 2 and 3 and Comparative example 3 was not less than 5.0×10$^{15}$ Ω·cm. The withstand voltage, the four-point bending strength, and the volume resistivity of the composite sintered body increased as the content of MgO in the raw material increased.

Examples 4 to 8

In Examples 4 to 8, the contents of MgO in the raw materials were the same, and the contents of SiC were different from each other. The sintering temperature in Examples 4 to 8 was 1600° C. In Example 4, the constituent phases of the composite sintered body which were identified by the X-ray diffraction were $Al_2O_3$ and $MgAl_2O_4$, and SiC was not detected. This is because the amount of SiC in the raw material was very small and the peak intensity was low, but by microstructure observation, a phase composed of SiC was observed. In Examples 5 to 8, the constituent phases of each composite sintered body which were identified by the X-ray diffraction were $Al_2O_3$, $MgAl_2O_4$ and SiC.

In Examples 4 to 8, the content of $Al_2O_3$ in the composite sintered body was not less than 95.5% by weight, and the content of Mg was not greater than 0.35% by weight. Specifically, the content of Mg in the composite sintered body was not greater than 0.07% by weight. The crystal phase amount ratio $MgAl_2O_4/Al_2O_3$ in the composite sintered body was 0.004 to 0.007. The open porosity of the composite sintered body was less than 0.05%, and substantially 0.0%. The bulk density of the composite sintered body was not less than 3.94 g/cm$^3$ and not greater than 3.98 g/cm$^3$. The bulk density of the composite sintered body decreased as the content of SiC in the raw material increased.

In Examples 4 to 8, the average sintered grain size of $Al_2O_3$ in the composite sintered body was not less than 2 μm and not greater than 4 μm, and the standard deviation of sintered grain size distribution of $Al_2O_3$ was not greater than 0.35. That is, the average sintered grain size of $Al_2O_3$ was small, and the uniformity of the sintered grain size was high. Specifically, the average sintered grain size of $Al_2O_3$ in each composite sintered body of Examples 4 to 8 was not greater than 3 μm. The standard deviation of sintered grain size distribution of $Al_2O_3$ in the composite sintered body of Example 4 was not greater than 0.25, and the standard deviation of sintered grain size distribution of $Al_2O_3$ in the composite sintered body of Examples 5 to 8 was not greater than 0.15. The average sintered grain size of $Al_2O_3$ and the standard deviation of sintered grain size distribution of $Al_2O_3$ decreased as the content of SiC in the raw material increased.

In each composite sintered body of Examples 4 to 8, the withstand voltage was not less than 100 kV/mm, the four-point bending strength was not less than 450 MPa, and the volume resistivity at 250° C. was not less than 1.0×10$^{15}$ Ω·cm. That is, in Examples 4 to 8, all of the withstand voltage, the four-point bending strength, and the volume resistivity were high. Specifically, in the composite sintered body of Examples 4 to 8, the withstand voltage was greater than 200 kV/mm, and the four-point bending strength was not less than 550 MPa. The volume resistivity at 250° C. of the composite sintered body of Example 4 was not less than 5.0×10$^{15}$ Ω·cm, and the volume resistivity at 250° C. of the composite sintered body of Examples 5 to 8 was not less than 1.0×10$^{16}$ Ω·cm. The four-point bending strength and the volume resistivity of the composite sintered body increased as the content of SiC in the raw material increased.

Examples 9 to 13

In Examples 9 to 13, the contents of MgO in the raw materials were the same, and the contents of SiC were different from each other. The sintering temperature in Examples 9 to 13 was 1600° C. as in Examples 4 to 8. In Examples 9 to 13, the particle diameter of the raw material SiC was greater than that in Examples 4 to 8 as described above. In Example 9, the constituent phases of the composite sintered body which were identified by the X-ray diffraction were $Al_2O_3$ and $MgAl_2O_4$, and a phase composed of SiC was observed by microstructure observation as in Example 4. In Examples 10 to 13, the constituent phases of each composite sintered body which were identified by the X-ray diffraction were $Al_2O_3$, $MgAl_2O_4$ and SiC.

In Examples 9 to 13, the content of $Al_2O_3$ in the composite sintered body was not less than 95.5% by weight, and the content of Mg was not greater than 0.35% by weight. Specifically, the content of Mg in the composite sintered body was not greater than 0.07% by weight. The crystal phase amount ratio $MgAl_2O_4/Al_2O_3$ in the composite sintered body was 0.005 to 0.006. The open porosity of the composite sintered body was less than 0.05%, and substantially 0.0%. The bulk density of the composite sintered body was not less than 3.94 g/cm$^3$ and not greater than 3.98 g/cm$^3$. The bulk density of the composite sintered body decreased as the content of SiC in the raw material increased.

In Examples 9 to 13, the average sintered grain size of Al$_2$O$_3$ in the composite sintered body was not less than 2 μm and not greater than 4 μm, and the standard deviation of sintered grain size distribution of Al$_2$O$_3$ was not greater than 0.35. That is, the average sintered grain size of Al$_2$O$_3$ was small, and the uniformity of the sintered grain size was high. Specifically, the average sintered grain size of Al$_2$O$_3$ in each composite sintered body of Examples 9 to 13 was not greater than 3 μm. The standard deviation of sintered grain size distribution of Al$_2$O$_3$ in the composite sintered body of Example 9 was not greater than 0.2, and the standard deviation of sintered grain size distribution of Al$_2$O$_3$ in the composite sintered body of Examples 10 to 13 was not greater than 0.15. The average sintered grain size of Al$_2$O$_3$ and the standard deviation of sintered grain size distribution of Al$_2$O$_3$ decreased as the content of SiC in the raw material increased.

In each composite sintered body of Examples 9 to 13, the withstand voltage was not less than 100 kV/mm, the four-point bending strength was not less than 450 MPa, and the volume resistivity at 250° C. was not less than $1.0 \times 10^{15}$ Ω·cm. That is, in Examples 9 to 13, all of the withstand voltage, the four-point bending strength, and the volume resistivity were high. Specifically, in the composite sintered body of Examples 9 to 13, the withstand voltage was greater than 200 kV/mm, the four-point bending strength was not less than 550 MPa, and the volume resistivity at 250° C. was not less than $1.0 \times 10^{16}$ Ω·cm. The four-point bending strength and the volume resistivity of the composite sintered body increased as the content of SiC in the raw material increased.

When Examples 4 to 8 and Examples 9 to 13 are compared, the effect of the difference in the particle diameters of SiC in the raw materials is not seen so much. It is considered that this is because the SiC powder is pulverized when the raw material is wet-mixed, and the particle diameters after pulverizing do not differ greatly. Therefore, the degree of freedom in selecting the particle diameter of SiC contained in the raw material can be increased.

Example 14 and Comparative Example 4

In Example 14 and Comparative example 4, the content and particle diameter of SiC in each raw material were the same as those in Example 11, and the content of MgO was greater than that in Example 11. The sintering temperature in Example 14 and Comparative example 4 was 1600° C. as in Example 11. In Example 14 and Comparative example 4, the constituent phases of each composite sintered body which were identified by the X-ray diffraction were Al$_2$O$_3$, MgAl$_2$O$_4$ and SiC as in Example 11.

In Example 14 and Comparative example 4, the content of Al$_2$O$_3$ in the composite sintered body was not less than 95.5% by weight, and the content of Mg was not greater than 0.35% by weight. In Example 14, the crystal phase amount ratio MgAl$_2$O$_4$/Al$_2$O$_3$ in the composite sintered body was 0.010. On the other hand, in Comparative example 4, the crystal phase amount ratio MgAl$_2$O$_4$/Al$_2$O$_3$ in the composite sintered body was as large as 0.022.

In Example 14 and Comparative example 4, the open porosity of the composite sintered body was less than 0.05%, and substantially 0.0%. The bulk density of the composite sintered body was not less than 3.94 g/cm$^3$ and not greater than 3.98 g/cm$^3$.

The bulk density of the composite sintered body decreased as the content of MgO in the raw material increased.

In Example 14 and Comparative example 4, the average sintered grain size of Al$_2$O$_3$ in the composite sintered body was not less than 2 μm and not greater than 4 μm, and the standard deviation of sintered grain size distribution of Al$_2$O$_3$ was not greater than 0.35. That is, the average sintered grain size of Al$_2$O$_3$ was small, and the uniformity of the sintered grain size was high. Specifically, the average sintered grain size of Al$_2$O$_3$ in the composite sintered body of Example 14 and Comparative example 4 was not greater than 3 μm. The standard deviation of sintered grain size distribution of Al$_2$O$_3$ in the composite sintered body of Example 14 and Comparative example 4 was not greater than 0.15. Even when the content of MgO in the raw material was set to be greater than 0.1% by weight, it was possible to obtain the composite sintered body in which the average sintered grain size of Al$_2$O$_3$ was small and in which the uniformity of sintered grain size was high. The average sintered grain size of Al$_2$O$_3$ and the standard deviation of sintered grain size distribution of Al$_2$O$_3$ in the composite sintered body of Example 14 and Comparative example 4 was similar to that of Example 11.

In each composite sintered body of Example 14 and Comparative example 4, the withstand voltage was not less than 100 kV/mm, the four-point bending strength was not less than 450 MPa, and the volume resistivity at 250° C. was not less than $1.0 \times 10^{15}$ Ω·cm. That is, in Example 14 and Comparative example 4, all of the withstand voltage, the four-point bending strength, and the volume resistivity were high. Specifically, in the composite sintered body of Example 14 and Comparative example 4, the withstand voltage was greater than 200 kV/mm, the four-point bending strength was not less than 550 MPa, and the volume resistivity at 250° C. was not less than $1.0 \times 10^{16}$ Ω·cm. The four-point bending strength and the volume resistivity of the composite sintered body increased as the content of MgO in the raw material increased.

Examples 15 to 17

Figure 3:
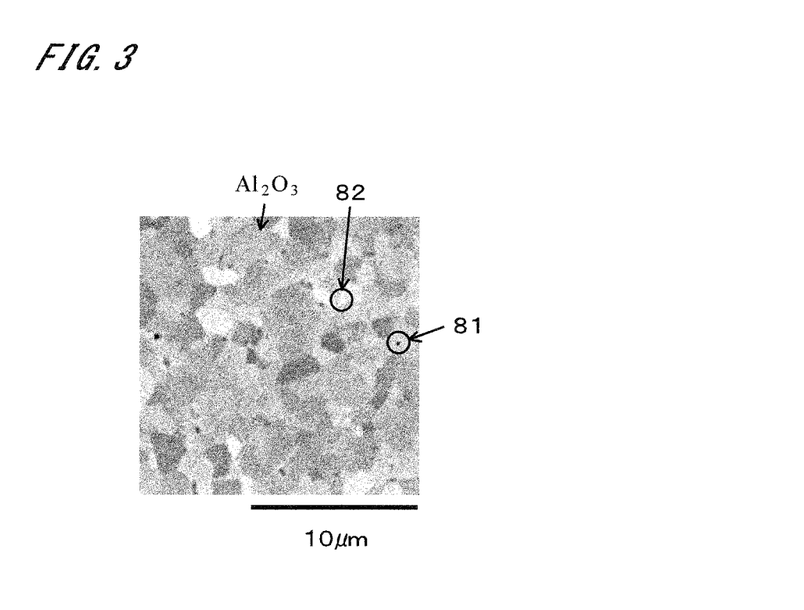
FIG. 3 is a SEM image of a polished surface of a composite sintered body.

In Examples 15 to 17, the contents of MgO in the raw materials were the same, and the amounts of SiC were different from each other. The sintering temperature in Examples 15 to 17 was 1550° C. In Example 15, the constituent phases of the composite sintered body which were identified by the X-ray diffraction were Al$_2$O$_3$ and MgAl$_2$O$_4$, and a phase composed of SiC was observed by microstructure observation as in Example 4. In Examples 16 and 17, the constituent phases of each composite sintered body which were identified by the X-ray diffraction were Al$_2$O$_3$, MgAl$_2$O$_4$ and SiC. FIG. 3 is a SEM image of a polished surface of the composite sintered body of Example 17. In FIG. 3, an MgAl$_2$O$_4$ and an SiC in the composite sintered body are denoted respectively by surrounding them with circles 81 and 82.

In Examples 15 to 17, the content of Al$_2$O$_3$ in the composite sintered body was not less than 95.5% by weight, and the content of Mg was not greater than 0.35% by weight. Specifically, the content of Mg in the composite sintered body was not greater than 0.07% by weight. The crystal phase amount ratio MgAl$_2$O$_4$/Al$_2$O$_3$ in the composite sintered body was 0.005 to 0.007. The open porosity of the composite sintered body was less than 0.05%, and substantially 0.0%. The bulk density of the composite sintered body was not less than 3.94 g/cm³ and not greater than 3.98 g/cm³. The bulk density of the composite sintered body decreased as the content of SiC in the raw material increased.

In Examples 15 to 17, the average sintered grain size of $Al_2O_3$ in the composite sintered body was not less than 2 μm and not greater than 4 μm, and the standard deviation of sintered grain size distribution of $Al_2O_3$ was not greater than 0.35. That is, the average sintered grain size of $Al_2O_3$ was small, and the uniformity of the sintered grain size was high. Specifically, in each composite sintered body of Examples 15 to 17, the average sintered grain size of $Al_2O_3$ was not greater than 3 μm, and the standard deviation of sintered grain size distribution of $Al_2O_3$ was not greater than 0.1. The average sintered grain size of $Al_2O_3$ and the standard deviation of sintered grain size distribution of $Al_2O_3$ decreased as the content of SiC in the raw material increased.

In each composite sintered body of Examples 15 to 17, the withstand voltage was not less than 100 kV/mm, the four-point bending strength was not less than 450 MPa, and the volume resistivity at 250° C. was not less than $1.0 \times 10^{15}$ Ω·cm. That is, in Examples 15 to 17, all of the withstand voltage, the four-point bending strength, and the volume resistivity were high. Specifically, in the composite sintered body of Examples 15 to 17, the withstand voltage was greater than 200 kV/mm, the four-point bending strength was not less than 550 MPa, and the volume resistivity at 250° C. was not less than $1.0 \times 10^{16}$ Ω·cm. The four-point bending strength and the volume resistivity of the composite sintered body increased as the content of SiC in the raw material increased.

Examples 18 and 19

In Examples 18 and 19, the content and particle diameter of SiC in each raw material were the same as those in Example 17, and the content of MgO was less than that in Example 17. The sintering temperature in Examples 18 and 19 was 1550° C. as in Example 17. In Examples 18 and 19, the constituent phases of each composite sintered body which were identified by the X-ray diffraction were $Al_2O_3$, $MgAl_2O_4$ and SiC as in Example 17.

In Examples 18 and 19, the content of $Al_2O_3$ in the composite sintered body was not less than 95.5% by weight, and the content of Mg was not greater than 0.35% by weight. Specifically, the content of Mg in the composite sintered body was not greater than 0.05% by weight. The crystal phase amount ratio $MgAl_2O_4/Al_2O_3$ in the composite sintered body was 0.003 to 0.004. The open porosity of the composite sintered body was less than 0.05%, and substantially 0.0%. The bulk density of the composite sintered body was not less than 3.94 g/cm³ and not greater than 3.98 g/cm³.

In Examples 18 and 19, the average sintered grain size of $Al_2O_3$ in the composite sintered body was not less than 2 μm and not greater than 4 μm, and the standard deviation of sintered grain size distribution of $Al_2O_3$ was not greater than 0.35. That is, the average sintered grain size of $Al_2O_3$ was small, and the uniformity of the sintered grain size was high. Specifically, the average sintered grain size of $Al_2O_3$ in the composite sintered body of Example 19 was not greater than 3 μm. The standard deviation of sintered grain size distribution of $Al_2O_3$ in the composite sintered body of Example 19 was not greater than 0.15. Even when the content of MgO in the raw material was set to be smaller than 0.1% by weight, it was possible to obtain the composite sintered body in which the average sintered grain size of $Al_2O_3$ was small and in which the uniformity of sintered grain size was high.

In each composite sintered body of Examples 18 and 19, the withstand voltage was not less than 100 kV/mm, the four-point bending strength was not less than 450 MPa, and the volume resistivity at 250° C. was not less than $1.0 \times 10^{15}$ Ω·cm. That is, in Examples 18 and 19, all of the withstand voltage, the four-point bending strength, and the volume resistivity were high. Specifically, in the composite sintered body of Examples 18 and 19, the withstand voltage was greater than 200 kV/mm, the four-point bending strength was not less than 550 MPa, and the volume resistivity at 250° C. was not less than $1.0 \times 10^{16}$ Ω·cm. The four-point bending strength and the volume resistivity of the composite sintered body increased as the content of MgO in the raw material increased.

As can be seen from Examples 18 and 19, when the sintering temperature is 1550° C., it is possible to obtain a composite sintered body with high withstand voltage, high four-point bending strength, and high volume resistivity, in which the average sintered grain size of $Al_2O_3$ is small and in which the uniformity of sintered grain size of $Al_2O_3$ is high, even if the content of MgO in the raw material is less than 0.1% by weight.

Comparative Example 5 and Examples 20 and 21

In Comparative example 5 and Examples 20 and 21, the contents of MgO in the raw materials were the same, and the amounts of SiC were different from each other. The sintering temperature in Comparative example 5 and Examples 20 and 21 was 1650° C. In Comparative example 5, the constituent phases of the composite sintered body which were identified by the X-ray diffraction were $Al_2O_3$ and $MgAl_2O_4$, and a phase composed of SiC was observed by microstructure observation as in Example 4. In Examples 20 and 21, the constituent phases of each composite sintered body which were identified by the X-ray diffraction were $Al_2O_3$, $MgAl_2O_4$ and SiC.

In Comparative example 5 and Examples 20 and 21, the content of $Al_2O_3$ in the composite sintered body was not less than 95.5% by weight, and the content of Mg was not greater than 0.35% by weight. Specifically, the content of Mg in the composite sintered body was not greater than 0.07% by weight. The crystal phase amount ratio $MgAl_2O_4/Al_2O_3$ in the composite sintered body was 0.006 to 0.007. The open porosity of the composite sintered body was less than 0.05%, and substantially 0.0%. The bulk density of the composite sintered body was not less than 3.94 g/cm³ and not greater than 3.98 g/cm³. The bulk density of the composite sintered body decreased as the content of SiC in the raw material increased.

In Comparative example 5, the average sintered grain size of $Al_2O_3$ in the composite sintered body was greater than 4 μm, and the standard deviation of sintered grain size distribution of $Al_2O_3$ was greater than 0.35. On the other hand, in Examples 20 and 21, the average sintered grain size of $Al_2O_3$ in the composite sintered body was not less than 2 μm and not greater than 4 μm, and the standard deviation of sintered grain size distribution of $Al_2O_3$ was not greater than 0.35. That is, in Examples 20 and 21, the average sintered grain size of $Al_2O_3$ was small, and the uniformity of the sintered grain size was high. Specifically, in the composite sintered body of Examples 20 and 21, the standard deviation of sintered grain size distribution of $Al_2O_3$ was not greater than 0.25. The average sintered grain size of $Al_2O_3$ and the standard deviation of sintered grain size distribution of $Al_2O_3$ decreased as the content of SiC in the raw material increased.

In each composite sintered body of Examples 20 and 21, the withstand voltage was not less than 100 kV/mm, the four-point bending strength was not less than 450 MPa, and the volume resistivity at 250° C. was not less than $1.0 \times 10^{15}$ Ω·cm. That is, in Examples 20 and 21, all of the withstand voltage, the four-point bending strength, and the volume resistivity were high. Specifically, in the composite sintered body of Examples 20 and 21, the withstand voltage was greater than 200 kV/mm, the four-point bending strength was not less than 500 MPa, and the volume resistivity at 250° C. was not less than $1.0 \times 10^{16}$ Ω·cm. On the other hand, the four-point bending strength in Comparative example 5 was less than 450 MPa. The four-point bending strength and the volume resistivity of the composite sintered body increased as the content of SiC in the raw material increased.

Comparative Examples 6 and 7, and Example 22

In Comparative examples 6 and 7, and Example 22, the contents of MgO in the raw materials were the same, and the amounts of SiC were different from each other. The sintering temperature in Comparative examples 6 and 7, and Example 22 was 1700° C. In Comparative example 6, the constituent phases of the composite sintered body which were identified by the X-ray diffraction were $Al_2O_3$ and $MgAl_2O_4$, and a phase composed of SiC was observed by microstructure observation as in Example 4. In Comparative example 7 and Example 22, the constituent phases of each composite sintered body which were identified by the X-ray diffraction were $Al_2O_3$, $MgAl_2O_4$ and SiC.

In Comparative examples 6 and 7, and Example 22, the content of $Al_2O_3$ in the composite sintered body was not less than 95.5% by weight, and the content of Mg was not greater than 0.35% by weight. Specifically, the content of Mg in the composite sintered body was not greater than 0.07% by weight. The crystal phase amount ratio $MgAl_2O_4/Al_2O_3$ in the composite sintered body was 0.006 to 0.008. The open porosity of the composite sintered body was less than 0.05%, and substantially 0.0%. The bulk density of the composite sintered body was not less than 3.94 g/cm³ and not greater than 3.98 g/cm³. The bulk density of the composite sintered body decreased as the content of SiC in the raw material increased.

In Comparative examples 6 and 7, the average sintered grain size of $Al_2O_3$ in the composite sintered body was greater than 4 µm, and the standard deviation of sintered grain size distribution of $Al_2O_3$ was greater than 0.35. On the other hand, in Example 22, the average sintered grain size of $Al_2O_3$ in the composite sintered body was not less than 2 µm and not greater than 4 µm, and the standard deviation of sintered grain size distribution of $Al_2O_3$ was not greater than 0.35. That is, in Example 22, the average sintered grain size of $Al_2O_3$ was small, and the uniformity of the sintered grain size was high. Specifically, in the composite sintered body of Example 22, the standard deviation of sintered grain size distribution of $Al_2O_3$ was not greater than 0.25. The average sintered grain size of $Al_2O_3$ and the standard deviation of sintered grain size distribution of $Al_2O_3$ decreased as the content of SiC in the raw material increased.

In the composite sintered body of Example 22, the withstand voltage was not less than 100 kV/mm, the four-point bending strength was not less than 450 MPa, and the volume resistivity at 250° C. was not less than $1.0 \times 10^{15}$ Ω·cm. That is, in Example 22, all of the withstand voltage, the four-point bending strength, and the volume resistivity were high. Specifically, in the composite sintered body of Example 22, the withstand voltage was 195 kV/mm, and the volume resistivity at 250° C. was $1.0 \times 10^{16}$ Ω·cm. On the other hand, the four-point bending strength in Comparative examples 6 and 7 was less than 450 MPa. The withstand voltage, the four-point bending strength, and the volume resistivity of the composite sintered body increased as the content of SiC in the raw material increased.

As described above, the composite sintered body includes $Al_2O_3$ and $MgAl_2O_4$. The content of $Al_2O_3$ in the composite sintered body is not less than 95.5% by weight. The average sintered grain size of $Al_2O_3$ in the composite sintered body is not less than 2 µm and not greater than 4 µm. The standard deviation of sintered grain size distribution of $Al_2O_3$ in the composite sintered body is not greater than 0.35. As above, by suppressing grain growth of $Al_2O_3$ in the composite sintered body and improving the uniformity of sintered particle size distribution, it is possible to provide a composite sintered body with high withstand voltage and high volume resistivity. The composite sintered body has high uniformity of sintered particle size distribution, and this can suppress variations in characteristics (for example, withstand voltage, volume resistivity, and the like) of the composite sintered body due to variations in sintering conditions. It is therefore possible to provide a composite sintered body with extremely high mass productivity.

Specifically, the withstand voltage of the composite sintered body is preferably not less than 100 kV/mm. This makes it possible to appropriately prevent or suppress electrical breakdown of the composite sintered body. The withstand voltage is more preferably not less than 150 kV/mm and further preferably not less than 200 kV/mm. The volume resistivity of the composite sintered body at 250° C. is preferably not less than $1.0 \times 10^{15}$ Ω·cm. This makes it possible to prevent or suppress current leakage through the composite sintered body. The volume resistivity is more preferably not less than $5.0 \times 10^{15}$ Ω·cm and further preferably not less than $1.0 \times 10^{16}$ Ω·cm.

In the above composite sintered body, by setting the average sintered grain size of $Al_2O_3$ to not greater than 4 µm, the standard deviation of the sintered grain size distribution can be further reduced, and higher withstand voltage and higher volume resistivity can be realized. Further, by setting the average sintered grain size of $Al_2O_3$ to not less than 2 µm, it is possible to prevent the $Al_2O_3$ grains from falling off the composite sintered body and to suppress generation of particles. The average sintered grain size is more preferably not less than 2.3 µm and not greater than 3.7 µm, and further preferably not less than 2.5 µm and not greater than 3.5 µm.

The bulk density of the above composite sintered body is not less than 3.94 g/cm³ and not greater than 3.98 g/cm³. As above, by increasing the bulk density to make the composite sintered body dense, higher withstand voltage and higher volume resistivity can be realized. Further, high bending strength can also be realized in the composite sintered body. Although the bulk density changes depending on the content of SiC, the bulk density is more preferably not less than 3.96 g/cm³ and not greater than 3.97 g/cm³.

In the above composite sintered body, the ratio of the amount of crystal phase of $MgAl_2O_4$ to that of $Al_2O_3$ is not less than 0.003 and not greater than 0.01. As above, by setting the ratio between the amounts of crystal phases to not less than 0.003, it is possible to appropriately suppress grain growth of $Al_2O_3$ in the composite sintered body. By setting the ratio between the amounts of crystal phases to not greater than 0.01, it is possible to prevent the amount of $MgAl_2O_4$ contained in the composite sintered body from becoming excessive, and to suppress damage (for example, cracks or breaks) to the composite sintered body due to the difference in coefficient of thermal expansion described above.

More preferably, the composite sintered body includes SiC, and the content of SiC is preferably not less than 0.01% by weight and not greater than 4% by weight. As above, since the composite sintered body includes $MgAl_2O_4$ and SiC, it is possible to appropriately suppress grain growth of $Al_2O_3$, and to reduce the standard deviation of sintered grain size distribution of $Al_2O_3$. By setting the content of SiC to not greater than 4% by weight, it is possible to suppress the decrease in withstand voltage and volume resistivity of the composite sintered body due to SiC, and the deterioration of corrosion resistance of the composite sintered body due to SiC. The content of SiC is more preferably not greater than 2% by weight and further preferably not greater than 1% by weight.

There is no upper limit to the content of Mg in the composite sintered body, but the content of Mg is preferably not greater than 0.35% by weight. This makes it possible to provide a high-purity composite sintered body that is often required for use as a semiconductor manufacturing apparatus member. The content of Mg is more preferably not greater than 0.07% by weight. When the raw material contains MgO and no SiC, the content of Mg in the composite sintered body is preferably not less than 0.05% by weight. When the raw material contains MgO and SiC, the content of Mg is preferably not less than 0.02% by weight. This can suppress grain growth of $Al_2O_3$ appropriately.

As described above, the four-point bending strength of the composite sintered body is preferably not less than 450 MPa. Thereby, it is possible to appropriately prevent or suppress damage to the composite sintered body. The four-point bending strength is more preferably not less than 500 MPa and further preferably not less than 550 MPa.

As described above, since the composite sintered body has high withstand voltage and high volume resistivity, it is suitable for a semiconductor manufacturing apparatus member used in a semiconductor manufacturing apparatus. The composite sintered body is particularly suitable for a semiconductor manufacturing apparatus member used in a high-power semiconductor manufacturing apparatus such as a high-power etching apparatus. As a preferable example of the semiconductor manufacturing apparatus member formed by using the composite sintered body, the above-described susceptor 1 may be adopted. As described above, the susceptor 1 includes the main body 21 formed of the composite sintered body and the internal electrode 23 which are located inside the main body 21.

As described above, the method of manufacturing a composite sintered body includes a step (Step S11) of molding mixed powder in which $Al_2O_3$ and MgO are mixed, into a green body having a predetermined shape and a step (Step S12) of generating a composite sintered body by sintering the green body. The content of $Al_2O_3$ in the mixed powder is not less than 95.5% by weight in Step S11. The average sintered grain size of $Al_2O_3$ after completion of Step S12 is not less than 2 μm and not greater than 4 μm. The standard deviation of sintered grain size distribution of $Al_2O_3$ after completion of Step S12 is not greater than 0.35. The bulk density of the composite sintered body is not less than 3.94 g/cm³ and not greater than 3.98 g/cm³. The composite sintered body includes $MgAl_2O_4$, and the ratio of amount of crystal phase of $MgAl_2O_4$ to that of $Al_2O_3$ is not less than 0.003 and not greater than 0.01. By the manufacturing method, it is possible to easily manufacture a dense composite sintered body with high withstand voltage, high volume resistivity, and high bending strength. It is also possible to suppress damage to the composite sintered body during manufacturing.

As described above, the mixed powder preferably contains SiC in Step S11, and the content of SiC in the mixed powder is preferably not less than 0.01% by weight and not greater than 4% by weight. This makes it possible to suppress the decrease in withstand voltage and volume resistivity of the composite sintered body due to SiC, and the deterioration of corrosion resistance of the composite sintered body due to SiC.

As described above, the content of MgO in the mixed powder in Step S11 is preferably not greater than 0.5% by weight. Therefore, the content of Mg in the composite sintered body can be reduced.

In Step S12, the sintering temperature is not lower than 1550° C. and not higher than 1700° C. As described above, since the variations in characteristics of the composite sintered body due to variations in sintering conditions are suppressed, the characteristics of the composite sintered body described above can be realized in a wide sintering temperature range.

The above-described composite sintered body, semiconductor manufacturing apparatus member, and manufacture of a composite sintered body allow various variations.

The content of SiC in the composite sintered body may be less than 0.01% by weight or greater than 4% by weight. The composite sintered body may be essentially free of SiC.

The content of Mg in the composite sintered body may be greater than 0.35% by weight.

The withstand voltage of the composite sintered body may be less than 100 kV/mm.

The volume resistivity of the composite sintered body at 250° C. may be less than $1.0 \times 10^{15}$ Ω·cm.

The four-point bending strength of the composite sintered body may be less than 450 MPa.

In the method of manufacturing a composite sintered body, the content of SiC in the mixed powder in Step S11 may be less than 0.01% by weight or greater than 4% by weight. The content of MgO in the mixed powder in Step S11 may be greater than 0.5% by weight. In Step S12, the sintering temperature may be lower than 1550° C. or higher than 1700° C.

In the susceptor 1, the internal electrode 23 may be an RF electrode for plasma processing. Alternatively, in addition to the internal electrode 23 for the electrostatic chuck, the RF electrode for plasma processing may be located inside the main body 21.

In the susceptor 1, a part of the main body 21 may be formed of a material different from the above-described composite sintered body (for example, $Al_2O_3$ sintered body not essentially containing $MgAl_2O_4$).

The above-described composite sintered body may be used for forming a semiconductor manufacturing apparatus member (for example, a ring, a dome, or the like) provided in a semiconductor manufacturing apparatus, other than the susceptor 1. Further, a member used in an apparatus other than the semiconductor manufacturing apparatus may be formed of the composite sintered body. For example, the composite sintered body may be used for forming a susceptor for supporting a substrate other than the semiconductor substrate, or may be used for forming a ceramic heater for heating an object.

The configurations in the above-discussed preferred embodiments and variations may be combined as appropriate only if these do not conflict with one another.

While the invention has been shown and described in detail, the foregoing description is in all aspects illustrative and not restrictive. It is therefore understood that numerous modifications and variations can be devised without departing from the scope of the invention.

INDUSTRIAL APPLICABILITY

The present invention can be used in fields relating to a semiconductor manufacturing apparatus, for example, manufacture of a susceptor for adsorbing and holding a semiconductor substrate using a Coulomb force or Johnsen-Rahbek force.

REFERENCE SIGNS LIST

1 Susceptor
9 Substrate
21 Main body
23 Internal electrode
S11, S12 Step

The invention claimed is:

1. A composite sintered body, comprising:
aluminum oxide; and
magnesium aluminate spinel, wherein
a content of said aluminum oxide is not less than 95.5% by weight,
an average sintered grain size of said aluminum oxide is not less than 2 μm and not greater than 4 μm,
a standard deviation of sintered grain size distribution of said aluminum oxide is not greater than 0.35,
a bulk density of said composite sintered body is not less than 3.94 g/cm$^3$ and not greater than 3.98 g/cm$^3$, and
a ratio of amount of crystal phase of said magnesium aluminate spinel to that of said aluminum oxide is not less than 0.003 and not greater than 0.01.

2. The composite sintered body according to claim 1, further comprising
silicon carbide, wherein
a content of said silicon carbide is not less than 0.01% by weight and not greater than 4% by weight.

3. The composite sintered body according to claim 1, wherein
a content of magnesium is not greater than 0.35% by weight.

4. The composite sintered body according to claim 1, wherein
a withstand voltage is not less than 100 kV/mm.

5. The composite sintered body according to claim 1, wherein
a volume resistivity at 250° C. is not less than $1.0 \times 10^{15}$ Ω·cm.

6. The composite sintered body according to claim 1, wherein
a four-point bending strength is not less than 450 MPa.

7. A semiconductor manufacturing apparatus member used in a semiconductor manufacturing apparatus, being formed by using the composite sintered body according to claim 1.

8. The semiconductor manufacturing apparatus member according to claim 7, comprising:
a plate-like main body formed by using said composite sintered body, having an upper surface on which a semiconductor substrate is to be placed; and
an internal electrode located inside said main body.

9. A method of manufacturing a composite sintered body, comprising:
a) molding mixed powder in which aluminum oxide and magnesium oxide are mixed, into a green body having a predetermined shape; and
b) generating a composite sintered body by sintering said green body, wherein
a content of said aluminum oxide in said mixed powder in said operation a) is not less than 95.5% by weight,
an average sintered grain size of said aluminum oxide after completion of said operation b) is not less than 2 μm and not greater than 4 μm,
a standard deviation of sintered grain size distribution of said aluminum oxide after completion of said operation b) is not greater than 0.35,
a bulk density of said composite sintered body is not less than 3.94 g/cm$^3$ and not greater than 3.98 g/cm$^3$,
said composite sintered body comprises magnesium aluminate spinel, and
a ratio of amount of crystal phase of said magnesium aluminate spinel to that of said aluminum oxide is not less than 0.003 and not greater than 0.01.

10. The method of manufacturing a composite sintered body according to claim 9, wherein
said mixed powder contains silicon carbide in said operation a), and
a content of said silicon carbide in said mixed powder is not less than 0.01% by weight and not greater than 4% by weight.

11. The method of manufacturing a composite sintered body according to claim 9, wherein
a content of said magnesium oxide in said mixed powder in said operation a) is not greater than 0.5% by weight.

12. The method of manufacturing a composite sintered body according to claim 9, wherein
a sintering temperature in said operation b) is not lower than 1550° C. and not higher than 1700° C.

* * * * *